US010645830B1

(12) United States Patent
Chen et al.

(10) Patent No.: US 10,645,830 B1
(45) Date of Patent: May 5, 2020

(54) HOUSING, ELECTRONIC DEVICE, AND METHOD FOR MANUFACTURING SAME

(71) Applicants: SHENZHEN FUTAIHONG PRECISION INDUSTRY CO., LTD., Shenzhen (CN); FIH (HONG KONG) LIMITED, Kowloon (HK)

(72) Inventors: Kun-Hua Chen, Kowloon (HK); Wei Deng, Shenzhen (CN); Ke-Long Wu, Shenzhen (CN)

(73) Assignees: SHENZHEN FUTAIHONG PRECISION INDUSTRY CO., LTD., Shenzhen (CN); FIH (HONG KONG) LIMITED, Kowloon (HK)

( * ) Notice: Subject to any disclaimer, the term of this patent is extended or adjusted under 35 U.S.C. 154(b) by 0 days.

(21) Appl. No.: 16/245,451

(22) Filed: Jan. 11, 2019

(30) Foreign Application Priority Data

Nov. 27, 2018 (CN) .......................... 2018 1 1429342

(51) Int. Cl.
*H05K 5/02* (2006.01)
*H04M 1/02* (2006.01)
*H05K 5/00* (2006.01)

(52) U.S. Cl.
CPC ........ *H05K 5/0243* (2013.01); *H04M 1/0249* (2013.01); *H04M 1/0254* (2013.01); *H05K 5/0017* (2013.01)

(58) Field of Classification Search
CPC ...... H05K 5/0243; H05K 5/0017; H05K 5/03; H05K 5/0217; H05K 5/0247; H05K 5/04; H05K 13/00; H05K 2201/09909; H05K 5/0004; H05K 5/0086; H05K 5/02; H05K 5/0208; H05K 7/1427; H05K 9/0067; H05K 1/0254; H05K 1/0249; H04M 1/0254; H04M 1/0249; H04M 1/0202; H04M 1/026; H04M 1/0283; H04M 1/0277; H04M 1/185; G06F 1/1626; G06F 1/1656; G06F 1/1613; G06F 1/1658; G06F 1/1628; G06F 1/1633; G06F 1/1637; G06F 1/1652; G06F 1/1677; G06F 1/1698; G06F 1/3265; G06F 2200/1633; H01Q 1/243; H01Q 13/10; H01Q 1/2266; H01Q 1/24; H01Q 1/242; H01Q 1/40; H01Q 1/42; H01Q 1/521; H01Q 9/0485
See application file for complete search history.

(56) References Cited

U.S. PATENT DOCUMENTS

| 8,597,744 B2* | 12/2013 | Guan ................... C23C 14/042 174/50 |
| 9,730,370 B2* | 8/2017 | Tsao ....................... H05K 13/00 |
| 2015/0021065 A1 | 1/2015 | Wang et al. |
| 2016/0072932 A1* | 3/2016 | Hill ...................... H04M 1/0249 455/575.1 |

(Continued)

FOREIGN PATENT DOCUMENTS

CN 103974577 B 8/2015

*Primary Examiner* — Abhishek M Rathod
(74) *Attorney, Agent, or Firm* — ScienBiziP, P.C.

(57) ABSTRACT

A housing of plastic strongly bonded to a metal frame is integrally formed as the housing of an electronic device. The metal frame includes at least one plastic grabbing recess to receive portion of a plastic member, an opening of the plastic grabbing recess carries convex teeth, the convex teeth narrow the opening of the plastic grabbing recess, and the convex teeth lock portions of the plastic member.

17 Claims, 8 Drawing Sheets

(56) References Cited

U.S. PATENT DOCUMENTS

| | | | |
|---|---|---|---|
| 2016/0116948 A1* | 4/2016 | Ou | G06F 1/1698 |
| 2016/0207104 A1 | 7/2016 | Wang et al. | |
| 2016/0224075 A1* | 8/2016 | Chen | G06F 1/1656 |
| 2016/0301441 A1* | 10/2016 | Wang | H04B 1/3888 |
| 2017/0078460 A1* | 3/2017 | Lee | H04M 1/0249 |
| 2018/0070465 A1* | 3/2018 | Cater | G06F 1/1626 |

* cited by examiner

HOUSING, ELECTRONIC DEVICE, AND METHOD FOR MANUFACTURING SAME

FIELD

The subject matter herein generally relates to electronic device housings.

BACKGROUND

Electronic devices are becoming lighter and thinner, and appearance of the electronic devices is also important. Therefore, a housing containing the electronic device should have good appearance, good mechanical strength, good heat dissipation, and other features.

Plastic material for a housing is usually insert molded with a metal frame. Plastic material can improve appearance of the housing. However, due to large difference between the plastic material and metal material, a bond between the plastic material and the metal frame is weak, and the plastic material is easily peeled from the metal frame.

Therefore, there is room for improvement within the art.

BRIEF DESCRIPTION OF THE DRAWINGS

Implementations of the present technology will now be described, by way of embodiments, with reference to the attached figures.

DETAILED DESCRIPTION

Figure 1:
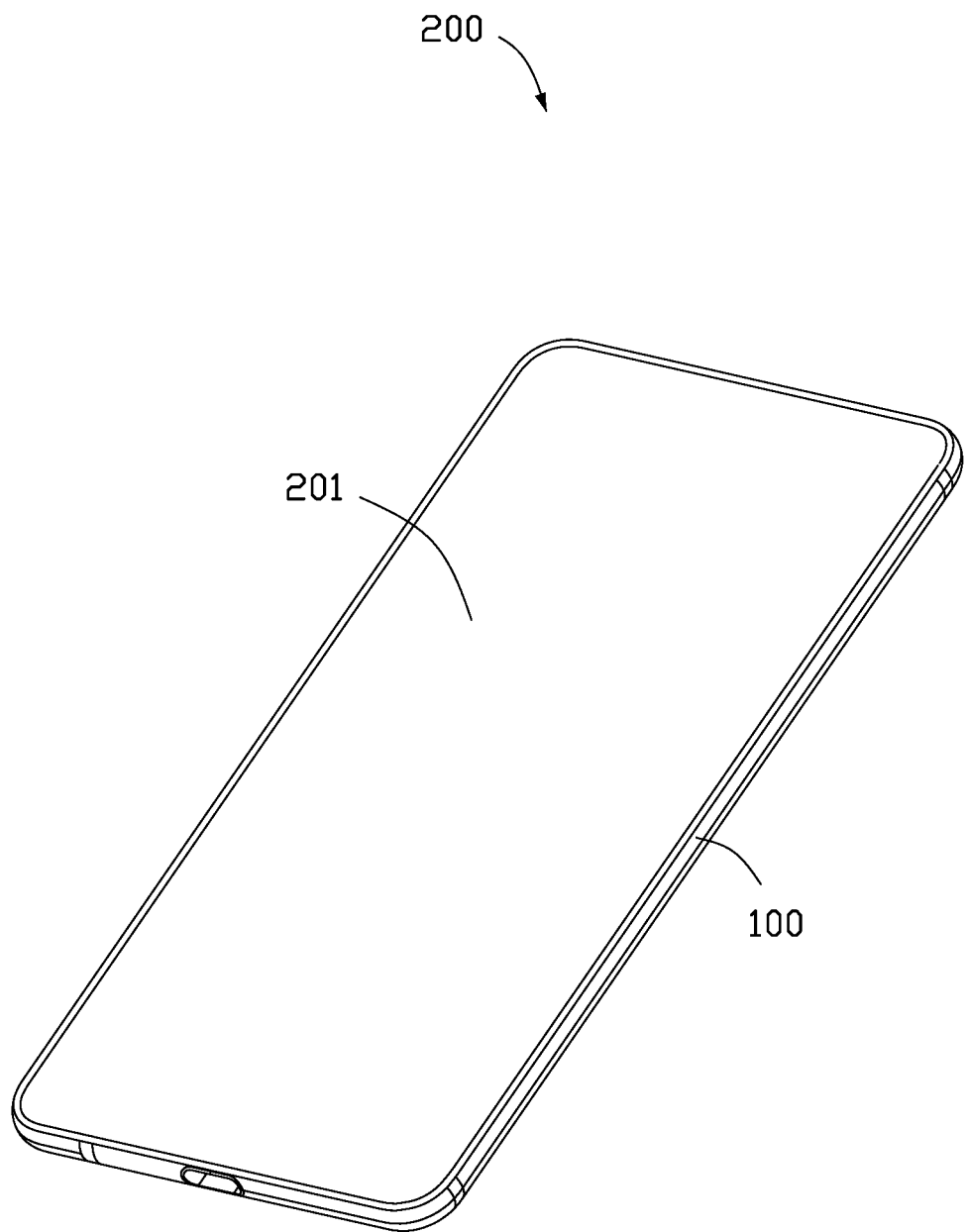
FIG. 1 is an isometric view of a housing for electronic device in accordance with one embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 2:
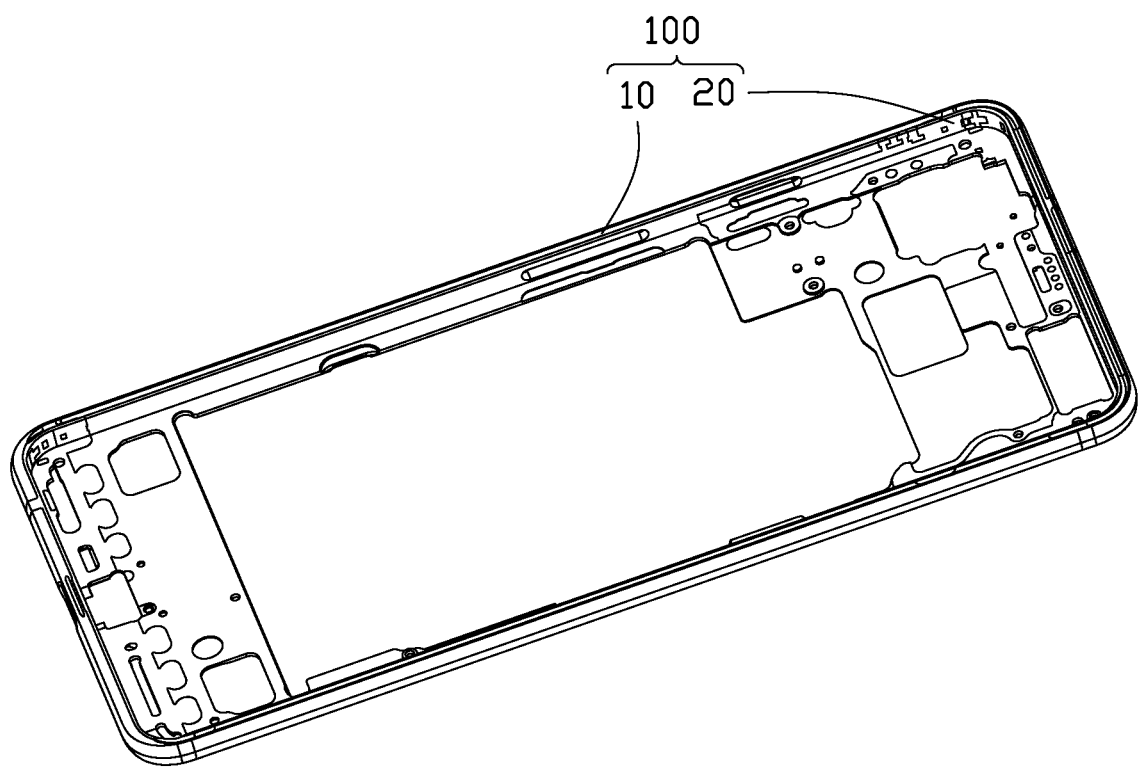
FIG. 2 is an isometric view of the housing with a metal frame.
Figure 3:
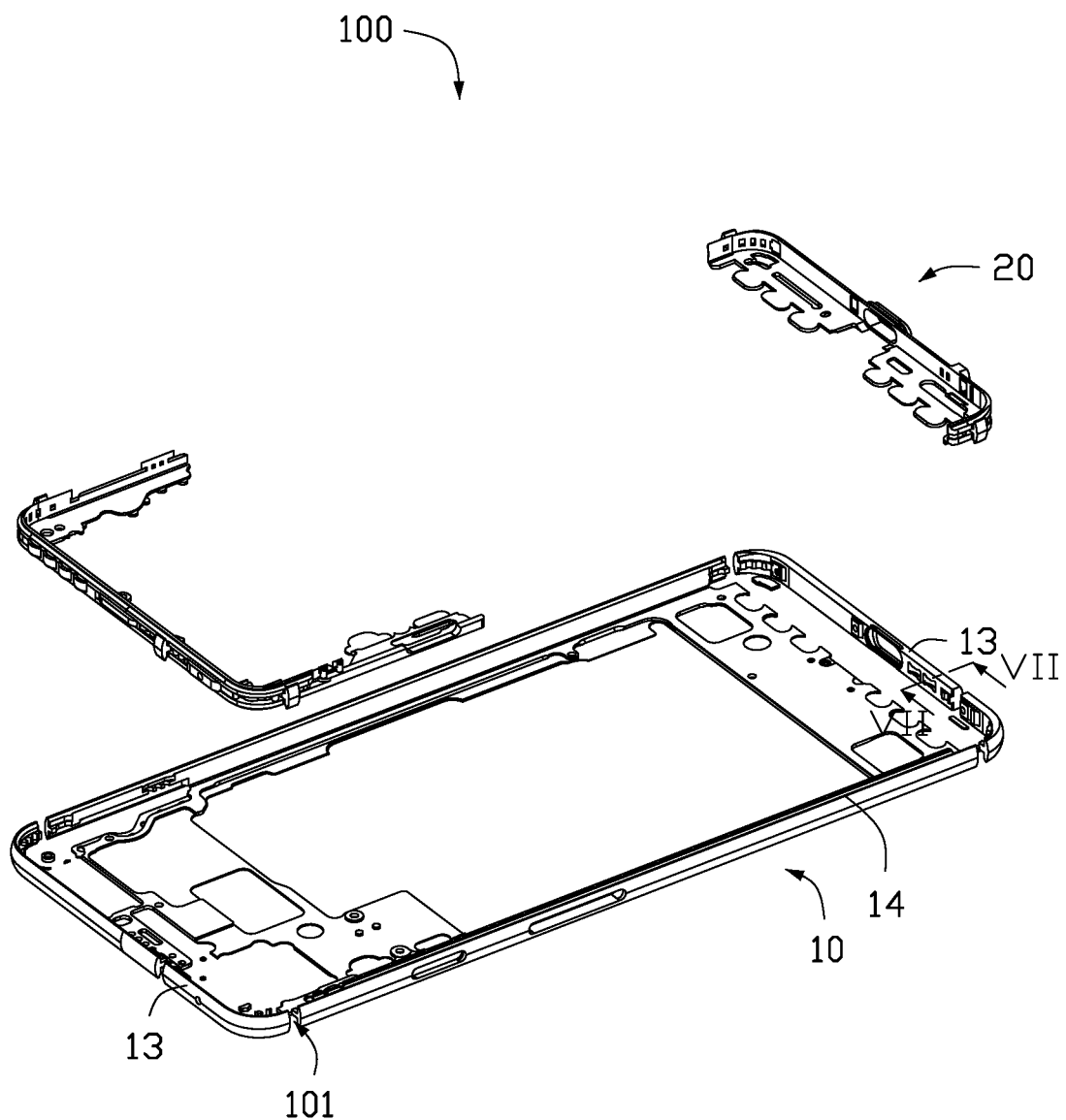
FIG. 3 is an exploded view of the housing in FIG. 2.
Figure 4:
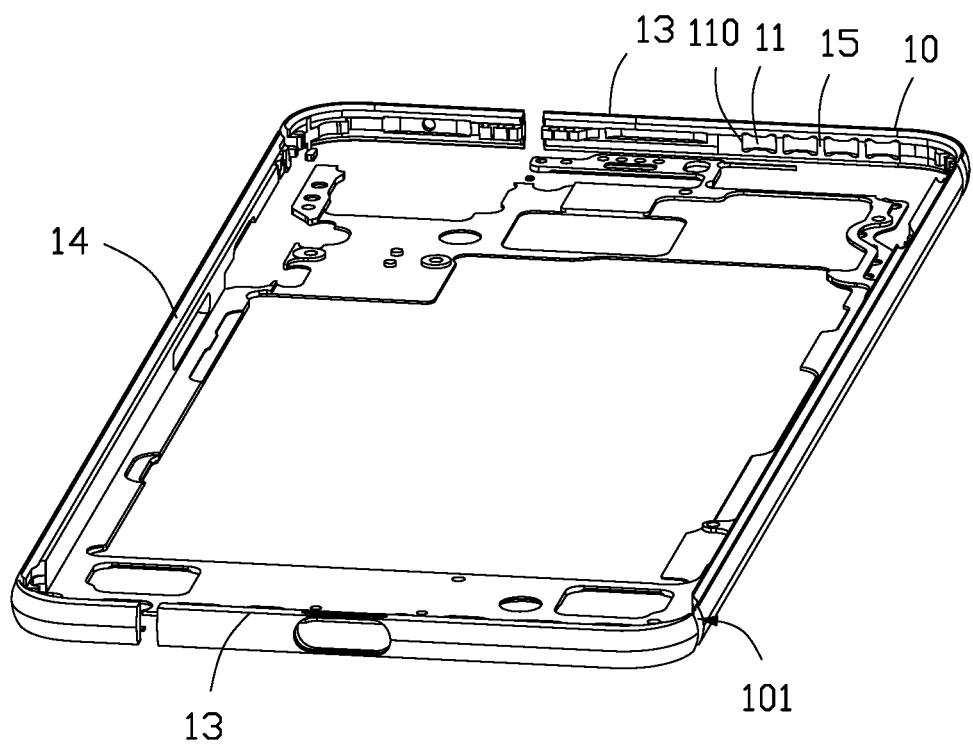
FIG. 4 is an isometric view of the metal frame in FIG. 2.

FIGS. 1-2 illustrate a housing 100 according to one embodiment. The housing 100 is applied to an electronic device 200. The electronic device 200 may be a mobile phone, a tablet computer, a digital camera, and so on. The electronic device 200 includes, but is not limited to, the housing 100 and a display 201, and the display 201 is mounted in the housing 100. The display 201 also enables interaction with a user. The electronic device 200 may further include, but is not limited to, other mechanical structures, electronic components, modules, and software that implement its functions.

The housing 100 includes a metal frame 10 and a plastic member 20. In the present embodiment, the housing 100 is a frame of the electronic device 200. The housing 100 may further include, but is not limited to, other mechanical structures, electronic components, modules, circuits, or the like. In this embodiment, the metal frame 10 is made of a material selected from the group consisting of stainless steel, aluminum, an aluminum alloy, magnesium metal, a magnesium alloy, titanium metal, a titanium alloy, copper metal, a copper alloy, or any combination thereof. The metal frame 10 and the plastic member 20 are integrally formed in a mold. The metal frame 10 may be prepared by a common technique such as a casting, stamping, or machining by computer numerical control (CNC) machine.

The plastic member 20 can be made of a thermoplastic or a thermosetting plastic. The thermoplastic may be polybutylene terephthalate (PBT), polyphenylene sulfide (PPS), polyethylene terephthalate (PET), polyetheretherketone (PEEK), polycarbonate (PC), or polyvinyl chloride (PVC), and the like. The thermosetting plastic may be an epoxy resin, a polyfluorocarbon resin, or a UV gel, and the like. The UV glue may be an acrylic resin or a polyurethane.

The metal frame 10 is substantially a rectangle. Preferably, the metal frame 10 comprises a plurality of metal strips 13 and a middle frame 14. The metal strips 13 are spaced apart from each other. The middle frame 14 is a hollow rectangular structure. The metal strips 13 are disposed at opposite sides of the middle frame 14. In this embodiment, two spaced metal strips 13 are on each side of the middle frame 14. Gaps 101 are formed between the metal strips 13, and between the end portions of each of the metal strips 13 and the end portions of the middle frame 14.

The plastic member 20 is formed on the inner surface 15 of the metal frame 10 and fills in the gaps 101. The metal strips 13 and the middle frame 14 are connected to each other by the plastic member 20 and altogether form the housing 100.

Figure 5:
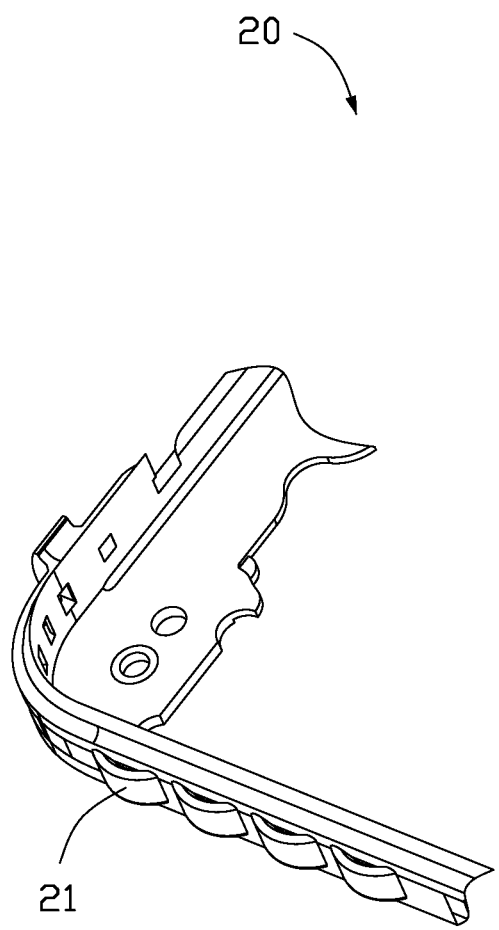
FIG. 5 is a portion isometric view of a plastic member of the housing in FIG. 2.
Figure 6:
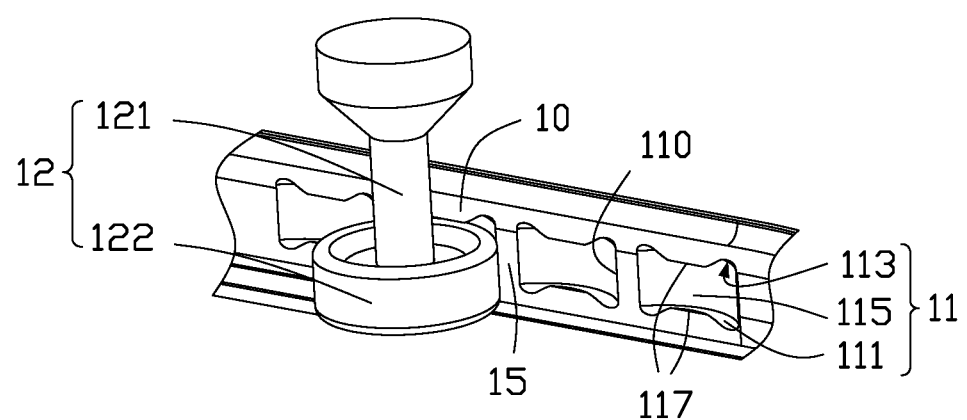
FIG. 6 is a manufacturing method for a metal frame.

Referring to FIGS. 5 and 6, an inner surface 15 of one of the two spaced metal strips 13 on one side of the middle frame 14 defines at least one plastic grabbing recess 11. The plastic member 20 is partially embedded in the plastic grabbing recess 11. The plastic grabbing recess 11 is formed by means of CNC technique. From the front, the plastic grabbing recess 11 resembles a dog bone in structure and includes a lower end surface 111, an upper end surface 113 opposite to the lower end surface 111, and a side surface 115 connecting the upper end surface 113 and the lower end surface 111. The plastic grabbing recess 11 is arc-shaped and generally concave. The plastic grabbing recess 11 is recessed from both ends to the middle longitudinally, that is, a distance between the side surface 115 and the inner surface 15 gradually increases from the edge to the middle of the plastic grabbing recess 11. The opening 110 of the plastic grabbing recess 11 carries a pair of convex teeth 117, the convex teeth 117 make the opening 110 of the plastic grabbing recess 11 narrower.

Figure 7:
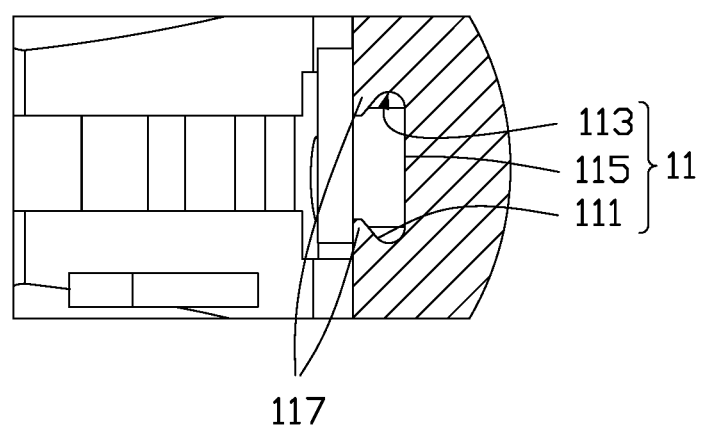
FIG. 7 is a cross-sectional view along line VII-VII in FIG. 3.

The pair of convex teeth 117 are aligned to each other. Specifically, in the present embodiment, middle of the edge of the lower end surface 111 and middle of the edge of the upper end surface 113 extend towards each other to form the convex teeth 117. The cross-sectional view of the plastic grabbing recess 11 in FIG. 7 shows that, along a thickness direction of the metal strips 13 at the convex teeth 117, the recess 11 is substantially "C" shaped. A convex tooth 117 is configured to lock the plastic member 20 in the plastic grabbing recesses 11 with a significantly greater bond, to prevent the plastic member 20 separating from the metal frame 10.

In other embodiments, a pair of convex teeth (not shown) can also be formed on the left side and on the right side of the plastic grabbing recess 11.

In the present embodiment, the plastic grabbing recess 11 is provided on the inner surface 15 of the metal strip 13 of the metal frame 10. In other embodiments, the plastic grabbing recesses 11 may also be provided on the middle frame 14 of the metal frame 10. The plurality of plastic grabbing recesses 11 are arranged at intervals. The plastic grabbing recess 11 receives the plastic member 20 and the plastic member 20 formed on the inner surface of the metal frame 10, that is, a strength of the metal frame 10 is enhanced by the plastic member 20, so that a thickness of the metal frame 10 can decreased. In the embodiment, a thickness of the metal frame 10 is less than or equal to 1.5 mm, reducing forging difficulty and CNC machining time. The housing 100 of the electronic device 200 is thereby thinned.

In the present embodiment, a portion of the plastic member 20 fills in the gaps 101 to connect the metal strip 13 and the middle frame 14. A portion of the plastic member 20 infills the plastic grabbing recesses 11 of the metal frame 10. The plastic member 20 infilling each plastic grabbing recess 11 forms a protruding portion 21. The protruding portion 21 is arc-shaped, an arcing shape increases a joint area with the metal frame 10, and thereby the binding force between the metal frame 10 and the plastic member 20 is increased.

Figure 8:
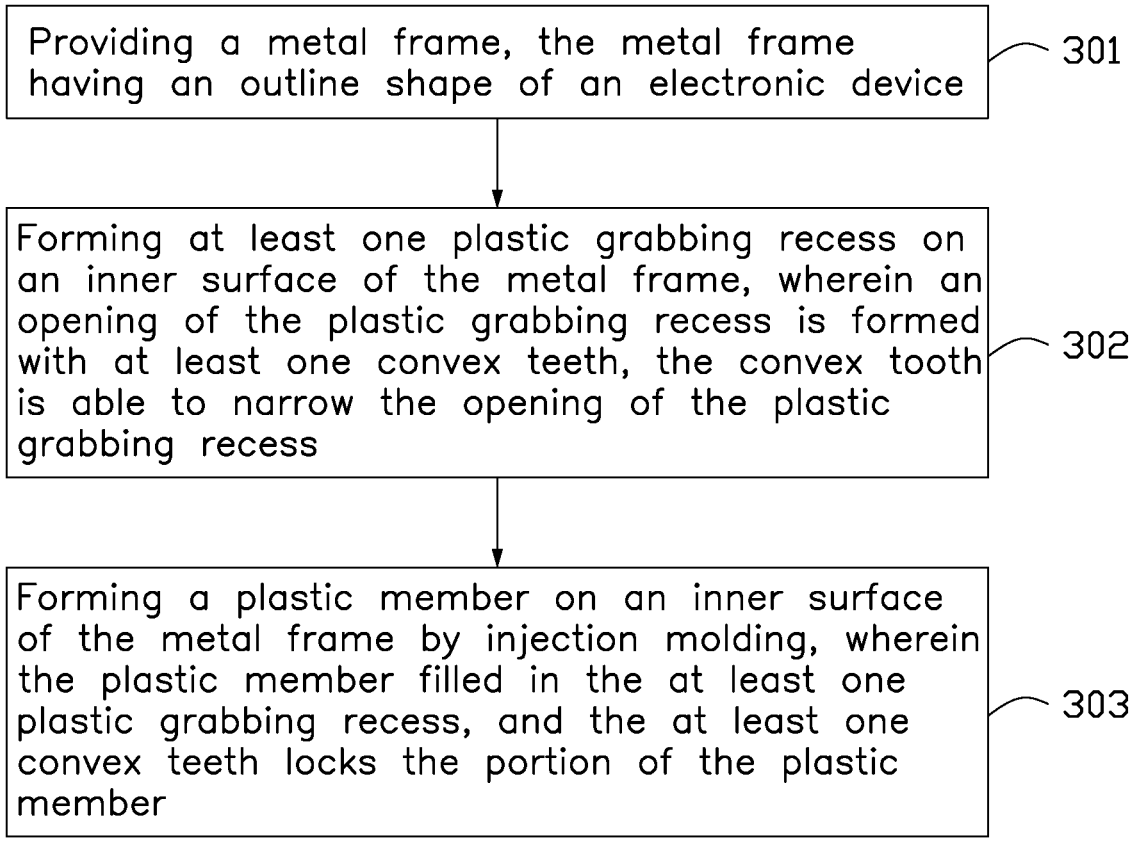
FIG. 8 is a flowchart of a manufacturing method for the housing.

FIG. 8 illustrates a method for manufacturing a housing 100 according to one embodiment of the present application. The method 300 is provided by way of example as there are a variety of ways to carry out the method. The method 300 can begin at block 301.

Block 301: a metal frame 10 is provided. The metal frame 10 has an outline shape of an electronic device 200. The metal frame 10 can be made of a material selected from a group consisting of stainless steel, aluminium, aluminium alloy, magnesium, magnesium alloy, titanium, titanium alloy, copper, and copper alloy or any combination thereof. The metal frame 10 can be made by casting, punching, or CNC technology.

The metal frame 10 is substantially a rectangle. Preferably, the metal frame 10 comprises a plurality of metal strips 13 and a middle frame 14. The middle frame 14 is a hollow rectangular structure. The metal strips 13 are disposed at two opposite ends of the middle frame 14, the metal strips 13 at each end are spaced apart from each other and spaced apart from the middle frame 14. In this embodiment, two spaced metal strips 13 are on each side of the middle frame 14. Gaps 101 are formed between the metal strips 13, and formed between end portions of the metal strips 13 and the middle frame 14.

Block 302: at least one plastic grabbing recess 11 is formed on the inner surface 15 of the metal frame 10 by CNC processing method. In the present embodiment, the at least one plastic grabbing recess 11 is formed in at least one of the plurality of metal strip 13.

In the present embodiment, the metal frame 10 is processed using CNC processing as shown in FIG. 6. In one embodiment, the plastic grabbing recesses 11 can be formed on the metal frame 10 by one milling molding with a machine tool 12. The machine tool 12 includes a shaft 121 and a machining end 122 connected at one end of the shaft 121. The machining end 122 is a cylindrical structure, the machining end 122 forms a roughly annular groove near one end of the shaft 121, and the machining end 122 forms a roughly ring groove away from the end of the shaft 121.

The inner surface 15 of the metal strip 13 is firstly milled through the machining end 122 of the machining tool 12 to form the upper end surface 113 and the lower end face 111 of the plastic grabbing recess 11. The machining end 122 is then moved up and down to milling the inner surface 15 to form the side surface 115 of the plastic grabbing recess 11. The plastic grabbing recess 11 is arc-shaped and generally concave. Both middle of the edge of the lower end surface 111 and middle of the edge of the upper end surface 113 extend in a direction close to each other to form the convex teeth 117.

The plastic grabbing recess 11 is recessed from both ends to the middle longitudinally, that is, a distance between the side surface 115 and the inner surface 15 of the plastic grabbing recess 11 gradually increases from the edge to the middle of the plastic grabbing recess 11. The opening 110 of the plastic grabbing recess 11 is formed with the convex teeth 117 and the convex teeth 117 are able to narrow the opening 110 of the plastic grabbing recess 11, thereby, plastic member 20 received in the plastic grabbing recess 11 is difficult peel off from the metal frame 10.

It is understood that in other embodiments, a general outline of the plastic grabbing recess 11 can be milled with a milling tool, and then the plastic grabbing recess 11 is machined by end milling such that each of the plastic grabbing recesses 11 is approximately a dog bone structure. To increase the bonding force between the metal frame 10 and the plastic member 20.

In the present embodiment, the metal frame 10 may be preheated by electric heating, plasma arc heating or laser heating before the plastic grabbing recess 11 is processed, so that the cutting part can be heated and softened. Hardness and shear strength can be properly reduced by plastic deformation, and the cutting performance is improved, the cutting force and power consumption is reduced, the vibration generated during the cutting process is reduced, and a size, shape and position tolerances of the plastic grabbing recess 11 is ensured. At the same time, a cutting speed can be improved on the basis of ensuring the surface roughness, and thus prolonging the service life of the machine tool.

In this embodiment, the special shape of the plastic grabbing recesses 11 can lock the plastic member 20, the metal frame 10 thus can be thinned, and the thickness of the metal frame 10 is can be controlled within about 1.5 mm, the forging difficulty of metal frame 10 and the processing time of CNC can be reduced, and the housing 100 of the electronic device 200 can be thinned.

Block 303: a plastic member 20 is formed with the metal frame 10 by injection molding. In particular, the metal frame 10 is placed in an injection molding mold cavity, and a molten plastic is injected into the injection molding mold cavity to form a plastic member 20. The plastic member 20 and the metal frame 10 together form the housing 100. The plastic member 20 is formed to connect the metal strips 13 and the middle frame 14 of the metal frame 10. Understandably, the plastic member 20 may be further covered in other areas of the metal frame 10 to increase an adhesion between the metal frame 10 and the plastic member 20.

In particular, the injection molding process may include embedding the metal frame 10 into a molding die (not shown) to adjust the ejection temperature and the ejection pressure. The molten plastic is also filled in the plastic grabbing recesses 11 of the metal frame 10. After the molten plastic is cooled, the plastic member 20 is combined with the metal frame 10. The plastic member 20 is configured to enhance a strength of the metal frame 10, thereby, a thickness of the metal frame 10 is thinned, and the plastic member 20 received in the plastic grabbing recesses 11 of the metal frame 10 is configured to enhance a bonding force between the plastic member 20 and the metal frame 10. Understandably, the plastic member 20 may be formed by general injection molding, or by NMT (Nano Mold Technology) processing.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A housing comprising:
a metal frame;
and a plastic member;
wherein the metal frame and the plastic member are integrally formed, the metal frame comprises a plastic grabbing recess to receive a portion of the plastic member, an opening of the plastic grabbing recess is formed with a first convex tooth, the first convex tooth narrows the opening of the plastic grabbing recess, and the first convex tooth locks the portion of the plastic member;
the metal frame defines space and is provided as periphery of the space;
the metal frame comprises a main surface, an upper surface, and a bottom surface, the main surface faces the space, the upper surface and the bottom surface are provided at opposite sides of the main surface, and the plastic grabbing recess is provided in the main surface.

2. The housing of claim 1, wherein the metal frame comprises a plurality of metal strips and a middle frame, the middle frame is a hollow structure, the plurality of metal strips are spaced apart from each other, and the plurality of metal strips are disposed at opposite sides of the middle frame.

3. The housing of claim 2, wherein a plurality of gaps are formed between the plurality of metal strips, and between the end portion of the plurality of metal strips and the end portions of the middle frame, portion of the plastic member is filled in the plurality of gaps.

4. The housing of claim 3, wherein the plastic grabbing recess is defined on an inner surface of the metal frame.

5. The housing of claim 4, wherein each side of the middle frame is provided with a first spaced metal strip and a second spaced metal strip, and the plastic grabbing recess is provided in an inner surface of one of the first spaced metal strip and the second spaced metal strip.

6. The housing of claim 5, wherein the plastic grabbing recess is concave and arc-shaped.

7. The housing of claim 6, wherein the plastic grabbing recess comprises a lower end surface, an upper end surface opposite to the lower end surface, and a side surface connecting the upper end surface and the lower end surface, the plastic grabbing recess further comprising a second convex tooth, the first convex tooth and the second convex tooth are respectively formed at the lower end surface and the upper end surface and extend in a direction close to each other.

8. The housing of claim 7, wherein a cross-sectional view of the plastic grabbing recess along a thickness direction of the first spaced metal strip at the convex tooth is substantially "C" shaped.

9. The housing of claim 1, wherein the metal frame is made of one material selected from a group consisting of stainless steel, aluminium, aluminium alloy, magnesium, magnesium alloy, titanium, titanium alloy, copper, copper alloy or any combination thereof.

10. The housing of claim 1, wherein the plastic member is made of a thermoplastic or a thermosetting plastic.

11. The housing of claim 10, wherein the thermoplastic is at least one polymer selected from a group consisting of polybutylene terephthalate, polyphenylene sulfide, polyethylene terephthalate, polyether ether ketone, polycarbonate, polyvinyl and chloride polymer, the thermosetting plastic is selected from a group consisting of polyurethane resin, epoxy resin, and polyurea resin.

12. An electronic device, comprising:
a display screen; and
a housing, the display screen being detachably mounted in the housing;
wherein the housing comprises:
a metal frame; and
a plastic member; wherein the metal frame and the plastic member are integrally formed, the metal frame comprises a plastic grabbing recess to receive a portion of the plastic member, an opening of the plastic grabbing recess is formed with at a first convex tooth, the first convex tooth narrows the opening of the plastic grabbing recess, and the first convex tooth locks the portion of the plastic member;
the metal frame defines space and is provided as periphery of the space;
the metal frame comprises a main surface, an upper surface and a bottom surface, the main surface faces the space, the upper surface and the bottom surface are provided at opposite sides of the main surface, and the plastic grabbing recess is provided in the main surface.

13. The electronic device of claim 12, wherein the plastic grabbing recess comprises a lower end surface, an upper end surface opposite to the lower end surface, and a side surface connecting the upper end surface and the lower end surface, the plastic grabbling recess further comprising a second convex tooth, the first convex tooth and the second convex tooth are respectively formed at the lower end surface and the upper end surface and extend in a direction close to each other.

14. The electronic device of claim 12, wherein the metal frame comprises a plurality of metal strips and a middle frame, the middle frame is a hollow structure, and the metal strips are disposed at opposite sides of the middle frame, each side of the middle frame is provided with a first spaced metal strip and a second spaced metal strips, and the plastic grabbing recess is provided on an inner surface of one of the first spaced metal strip and the second spaced metal strip.

15. The electronic device of claim 14, wherein a cross-sectional view of the plastic grabbing recess along a thickness direction of the first spaced metal strip at the convex tooth is substantially "C" shaped.

16. The electronic device of claim 14, wherein a plurality of gaps are formed between the first spaced metal strip and the second spaced metal strip, and between the end portion of the first spaced metal strips, the second spaced metal strip and the end portions of the middle frame, a portion of the plastic member is filled in the gaps.

17. The electronic device of claim 16, wherein the plastic grabbing recess is arc-shaped in a horizontal direction and in a vertical direction.

* * * * *